(12) United States Patent
Morganelli

(10) Patent No.: US 9,441,070 B2
(45) Date of Patent: Sep. 13, 2016

(54) DIVINYLARENE DIOXIDE COMPOSITIONS HAVING REDUCED VOLATILITY

(71) Applicant: Rohm and Haas Electronic Materials LLC, Marlborough, MA (US)

(72) Inventor: Paul L. Morganelli, Upton, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 14/024,576

(22) Filed: Sep. 11, 2013

(65) Prior Publication Data

US 2015/0072478 A1  Mar. 12, 2015

(51) Int. Cl.
| | |
|---|---|
| H01L 21/00 | (2006.01) |
| C08G 59/50 | (2006.01) |
| H01L 23/29 | (2006.01) |
| C08K 3/00 | (2006.01) |
| H01L 21/56 | (2006.01) |

(52) U.S. Cl.
CPC .......... C08G 59/5033 (2013.01); C08K 3/0033 (2013.01); H01L 23/293 (2013.01); *H01L 21/563* (2013.01); *H01L 2924/0002* (2013.01)

(58) Field of Classification Search
CPC .................. H01L 2924/0002; H01L 2924/00; H01L 21/563; H01L 23/293; C08G 59/5033; C08K 3/36

USPC ........................................... 438/124; 523/466
See application file for complete search history.

(56) References Cited

U.S. PATENT DOCUMENTS

| | | | |
|---|---|---|---|
| 2,912,389 A | 11/1959 | Phillips et al. | |
| 2,917,493 A | 12/1959 | Phillips et al. | |
| 2,918,444 A | 12/1959 | Phillips et al. | |
| 2,924,580 A | 2/1960 | Phillips et al. | |
| 3,981,821 A * | 9/1976 | Kiritani .................... | B01J 13/16 264/4.3 |
| 7,022,410 B2 | 4/2006 | Tonapi et al. | |
| 7,047,633 B2 | 5/2006 | Morganelli et al. | |
| 7,183,139 B2 | 2/2007 | Jayaraman et al. | |
| 7,262,077 B2 | 8/2007 | Lai et al. | |
| 7,351,784 B2 | 4/2008 | Lehman, Jr. et al. | |
| 2005/0170188 A1* | 8/2005 | Campbell .............. | C08G 59/24 428/413 |
| 2006/0147719 A1 | 7/2006 | Rubinsztajn et al. | |
| 2006/0219757 A1 | 10/2006 | Rubinsztajn | |
| 2006/0275608 A1 | 12/2006 | Tonapi et al. | |
| 2011/0122590 A1 | 5/2011 | Wilson et al. | |

* cited by examiner

*Primary Examiner* — Duy T Nguyen
(74) *Attorney, Agent, or Firm* — S. Matthew Cairns

(57) ABSTRACT

Compositions containing a divinylarene dioxide and a hydroxy-substituted dioxide compound and having relatively low viscosity and reduced volatility are used as underfills in the manufacture of electronic assemblies.

12 Claims, No Drawings

DIVINYLARENE DIOXIDE COMPOSITIONS HAVING REDUCED VOLATILITY

The present invention relates to epoxy resin formulations useful in the manufacture of electronic assemblies, and more particularly to capillary underfill compositions.

Epoxy resins are commonly used in the electronics industry for making semiconductor packaging materials. Current epoxy resin formulations used in semiconductor packaging materials include, for example, high purity diglycidyl ether of bisphenol F or diglycidyl ether of bisphenol A along with high performance or multifunctional resins such as the digylcidyl ether of naphthalene diol or the triepoxide of para-aminophenol. The known epoxy resins suffer from balancing key attributes required for acceptable processability and downstream reliability. These attributes include viscosity, total chloride content, filler loading (for coefficient of thermal expansion (CTE) and modulus modification), adhesion, flux compatibility, toughness, dispense-ability, flow, and package level reliability performance including preconditioning, temperature cycle or shock, highly accelerated stress testing (HAST).

Conventional underfill formulation approaches incorporate high purity bisphenol F or bisphenol A epoxy resins along with high performance or multifunctional epoxy resins. The inclusion of the high performance resins tends to increase the viscosity of the resultant blend negatively impacting the processability of the formulation, limiting both the amount and size of the particulate filler that can be incorporated into the formulation. Trends in electronic packaging designs toward smaller, stacked and high pitch configurations increase the demands on electronic packaging materials requiring better thermomechanical and processing performance. For example, new underfill materials for electronic packaging need to have a lower CTE for resistance to thermal fatigue, while new thermal interface materials need to be more thermally-conductive for cooling a heat-generating source while maintaining low viscosity with increased filler loadings.

Many electronic packaging materials are highly filled materials. The properties of the filled materials largely depend on the type of filler used and the level of filler loading (or amount of filler in the materials). In general, increasing the filler loading level usually decreases the CTE while the modulus and thermal conductivity increase. Unfortunately, the viscosity of the material also increases with an increase in filler loading. During the application of these filled materials for electronic packaging, underfill encapsulants are required to have a low viscosity (for example, less than 0.7 Pa-s at the dispense temperature) for adequate processing and complete, void-free, underfilling of a die. Thus, relatively higher application temperatures are required to ensure adequate flow of conventional, highly-filled underfill formulations.

Typical capillary underfill formulations incorporate the digycidyl ethers of bisphenol A or bisphenol F along with modifiers to improve the thermomechanical properties, such as the glass transition temperature ($T_g$), of the cured system. Such capillary underfills suffer from relatively higher viscosity, making their use more challenging. U.S. Pat. App. Pub. No. 2011/0122590 discloses an improved underfill composition utilizing a divinylarene dioxide and having a relatively low viscosity, making it advantageous as a capillary underfill. However, divinylarene dioxide compositions have been found to have undesirable volatility under certain conditions, such as when cured with an aromatic amine at elevated temperatures (ca. 100-150° C.) where >5 wt % of the dioxide may volatilize. Such volatilization is undesirable as it may result in the formation of voids during the cure cycle. Accordingly, there remains a need for capillary underfill compositions having relatively low viscosity and reduced volatility.

The present invention provides a composition suitable for use as a capillary underfill comprising a divinylarene dioxide, a hydroxy-substituted dioxide compound, and a curing agent. Preferably, the present compositions further comprise an inorganic filler. The present compositions have reduced volatility during cure cycles at elevated temperatures compared to known capillary underfill compositions comprising a divinylarene dioxide.

Also provided by the present invention is a method of forming an electronic assembly comprising: providing an electronic component and a substrate, wherein one of the electronic component and the substrate has a plurality of interconnect structures and the other has a plurality of conductive bonding pads; electrically connecting the electronic component and the substrate; forming an underfill composition between the electronic component and the substrate; and curing the underfill composition; wherein the underfill composition comprises a divinylarene dioxide, a hydroxy-substituted dioxide compound, and a curing agent.

Also provided is an electronic assembly including an electronic component electrically connected to a substrate having an underfill composition between the electronic component and the substrate, wherein the underfill composition comprises a reaction product of a divinylarene dioxide, a hydroxy-substituted dioxide compound and a curing agent.

As used throughout this specification, the following abbreviations shall have the following meanings, unless the context clearly indicates otherwise: ° C.=degrees Centigrade; min.=minute; g/mol=grams per mole; ppm=parts per million; CTE=coefficient of thermal expansion; wt %=weight percent; vol %=volume percent; g=grams; mg=milligrams; and μm=micron=micrometer. All amounts are percent by weight and all ratios are molar ratios, unless otherwise noted. All numerical ranges are inclusive and combinable in any order, except where it is clear that such numerical ranges are constrained to add up to 100%. As used herein, the ranges include the endpoints. The terms "dioxide" and "diepoxide" are used interchangeably.

The present compositions comprise a divinylarene dioxide, a hydroxy-substituted dioxide compound, a curing agent, optionally an inorganic filler, optionally one or more additional epoxy components, and optionally a catalyst. The present compositions may also optionally contain one or more of rheology modifiers, filler dispersants, pigments, adhesion promoters, and mixtures thereof. The divinylarene dioxide may comprise, for example, any substituted or unsubstituted arene nucleus bearing two vinyl oxide groups in any ring position. The divinylarene portion of the divinylarene dioxide may be ortho, meta, or para isomers or any mixture thereof. The arene portion of the divinylarene dioxide may comprise benzene, substituted benzenes, ring-annulated benzenes, substituted ring-annulated benzenes, homologously bonded benzenes, substituted homologously bonded benzenes, or mixtures thereof. The arene portion of the divinylarene dioxide may be substituted with one or more groups selected from ($C_1$-$C_{10}$)alkyl, ($C_6$-$C_{20}$)aryl, halogen, nitro, isocyanate, or RO— (where R may be a ($C_1$-$C_{10}$)alkyl or ($C_6$-$C_{20}$)aryl). Ring-annulated benzenes may comprise for example naphthlalene, tetrahydronaphthalene, and the like. Homologously bonded (substituted) benzenes may comprise for example biphenyl, diphenylether, and the like.

The divinylarene dioxide used for preparing the present compositions may be illustrated generally by chemical Structures I-IV as follows:

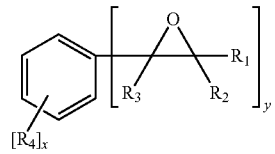

Structure I

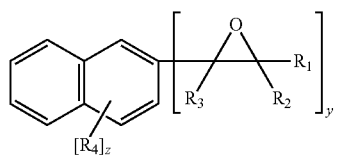

Structure II

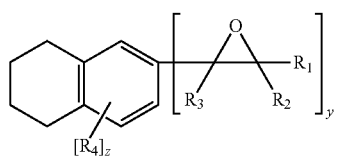

Structure III

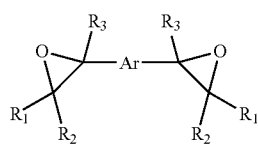

Structure IV

In the above Structures I, II, III, and IV, each $R_1$, $R_2$, $R_3$ and $R_4$ individually may be hydrogen, an alkyl, cycloalkyl, an aryl or an arylalkyl group; or a group selected from a halogen, a nitro, an isocyanate, and an RO group, wherein R may be an alkyl, aryl or arylalkyl; x is an integer of 0 to 4; y is an integer greater than or equal to 2; x+y is an integer less than or equal to 6; z is an integer of 0 to 6; and z+y is an integer less than or equal to 8; and Ar is an arene fragment including, for example, 1,3-phenylene group. In addition, $R_4$ can be a reactive group(s) including epoxide, isocyanate, or any reactive group and Z is an integer from 0 to 6 depending on the substitution pattern.

Divinylarene dioxides may be produced, for example, by the process described in International Patent Application WO 2010/077483. The divinylarene dioxides useful in the present invention are also disclosed in, for example, U.S. Pat. No. 2,924,580.

Suitable divinylarene dioxides useful in the present invention may comprise, for example, divinylbenzene dioxide, divinylnaphthalene dioxide, divinylbiphenyl dioxide, divinyldiphenylether dioxide, and mixtures thereof. It is preferred that the divinylarene dioxide is divinylbenzene dioxide (DVBDO), as illustrated by Structure V.

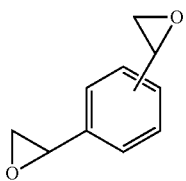

Structure V

DVBDO has an epoxide equivalent weight of 81 g/mol. When DVBDO is prepared by known processes, it is possible to obtain one of three possible isomers: ortho, meta, and para, or a mixture of such isomers. As used herein, DVBDO refers to a single isomer of divinylbenzene dioxide or a mixture of isomers. DVBDO is generally in a range of from 9:1 to 1:9 ratio of meta to para isomers. Preferably, the DVBDO is a range of from 6:1 to 1:6 ratio of meta to para isomers, more preferably from 4:1 to 1:4, and yet more preferably from 2:1 to 1:2.

The divinylarene dioxide may contain quantities (such as, for example, <20 wt %) of substituted arenes. The amount and structure of the substituted arenes depend on the process used in the preparation of the divinylarene precursor. For example, divinylbenzene prepared by the dehydrogenation of diethylbenzene (DEB) may contain quantities of ethylvinylbenzene (EVB) and DEB. Upon reaction with hydrogen peroxide, EVB produces ethylvinylbenzene monoxide. The presence of these compounds can increase the epoxide equivalent weight of the divinylarene dioxide to a value greater than that of the pure compound but can be utilized at levels of 0 to 99% of the epoxy resin portion.

The amount of the divinylarene dioxide used in the present compositions may depend on the fractions of the other composition components. In general the epoxy resin portion ranges from 2 to 80 wt %, preferably, from 5 to 50 wt %, more preferably from 10 to 30 wt %, based on the total weight of the resin.

Any hydroxy-substituted dioxide compound may be used in the present invention. Such hydroxy-substituted dioxide compound may be aliphatic or aromatic, and may contain one or more hydroxy substituents. Preferably, the hydroxy-substituted dioxide compound comprises one hydroxy substituent. Exemplary hydroxy-substituted dioxide compounds useful in the present invention are those of Structure VI:

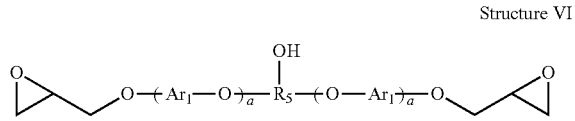

Structure VI where $Ar_1$ is an arene residue, $R_5$ is a $(C_1-C_{12})$alkylene or $(C_1-C_{12})$alkylidene, and a=0 or 1. The arene residue, $Ar_1$, may comprise benzene, substituted benzenes, ring-annulated benzenes, substituted ring-annulated benzenes, homologously bonded benzenes, substituted homologously bonded benzenes, or mixtures thereof. Additional substituents may consist of $H_2O_2$-resistant groups including saturated alkyl, aryl, halogen, nitro, isocyanate, or RO— (where R may be a saturated alkyl or aryl). Ring-annulated benzenes may comprise for example naphthlalene, tetrahydronaphthalene, and the like. Homologously bonded (substituted) benzenes may comprise for example biphenyl, diphenylether, and the like. It is preferred that $Ar_1$ is benzene or a $(C_1-C_4)$alkyl-substituted benzene. It is preferred that $R_5$ is a $(C_3-C_{12})$ alkylene or ($C_3$-$C_{12}$)alkylidene, more preferably ($C_3$-$C_6$) alkylene or ($C_3$-$C_6$)alkylidene, and most preferably ($C_3$) alkylene. Preferred hydroxy-substituted dioxide compounds are: a reaction product of a reaction product of catechol with epichlorohydrin; a reaction products of t-butylcatechol with epichlorohydrin; and glycerol diglycidyl ether. Mixtures of hydroxy-substituted dioxide compounds may be used in the present invention.

The amount of the hydroxy-substituted dioxide compound useful in the invention can vary depending on the hydroxyl equivalent weight as well as the fractions of the other composition components. In general, the hydroxyl-substituted dioxide compound is used in an amount from 2 to 80 wt %, more preferably from 5 to 50 wt %, and most preferably from 10 to 30 wt %, based on the total weight of the resin, that is, the total weight of the epoxide components and the curing agent.

Curing agents (or hardeners) useful in the present invention are any suitable epoxy curing agents known in the art, which are suitable for curing (polymerizing) epoxy resins. Exemplary curing agents include, without limitation, dicyandiamide, substituted guanidines, phenolics, amino, benzoxazine, anhydrides, amido amines, polyamides, polyamines, aromatic amines, aliphatic amines, polyesters, polyisocyanates, polymercaptans, urea formaldehyde and melamine formaldehyde resins, and mixtures thereof. Preferably, the curing agent is an aromatic amine Preferred curing agents include: methylene-bis(o-ethyl aniline); diethyltoluene diamine; diaminodiphenyl sulfone; diaminodiphenyl sulfide; and their alkylated derivatives. Mixtures of curing agents, such as mixtures or aromatic amines, may be used in the present invention. In one embodiment, the present compositions are substantially free of anhydrides, and are preferably free of anhydrides.

The amount of the curing agent in the present invention depends on stoichiometric considerations (molar ratio) of total epoxy resin. A typical molar ratio of epoxy to curing agent is 0.25 to 4, more preferably 0.5 to 2, and most preferably 0.9 to 1.1.

Optionally, the present compositions may comprise an inorganic filler. Preferably, the compositions of the invention comprise an inorganic filler. Inorganic filler is used to lower the overall CTE of the underfill. The inorganic filler used in the present invention is non-conductive, and is inert, that is, it will not react with or destabilize the underfill composition. Suitable inorganic filler includes, without limitation, silica, metals, metal oxides, ceramics, hollow fillers, graphite, carbon nanotubes, graphene, glass fibers/sheets, carbon fibers, or other organic or inorganic particulate filler. Exemplary metals useful as inorganic filler include silver, aluminum, and gold. Exemplary metal oxides include aluminum trihydroxide, aluminum hydroxide oxide, mica, and zinc oxide. Suitable ceramic inorganic fillers are crystalline or amorphous oxides, nitrides or carbides, such as, but not limited to, zirconia, berylia, ceria, aluminum nitride, boron nitrice, silicon carbide, and silicon nitride. It is preferred that the inorganic filler is chosen from silica, alumina, zirconia, berylia, ceria, zinc oxide, silicon nitride, aluminum nitride, boron nitride, and silicon carbide, and more preferably silica, alumina, zirconia, silicon nitride, aluminum nitride, boron nitride, and silicon carbide. More preferably, the inorganic filler is silica, whether fused, natural or synthetic. Mixtures of inorganic filler may be used. The surface of the fillers may optionally be treated to improve filler and polymer interaction. The inorganic filler may have any suitable shape and size. Preferably, the inorganic filler has a spherical or substantially spherical shape. Such spherical shape minimizes surface area and allows for a higher loading of filler in the underfill composition. It is preferred that the inorganic filler has a mean particle size of 0.005 to 10 μm, more preferably from 0.01 to 5 μm, and yet more preferably 0.01 to 3 μm. An amount of inorganic filler is used in the composition in order to get the CTE of the underfill close to the relatively lower CTE of the component (e.g., silicon in the case of a silicon wafer) for silicon to silicon bonding, or between the relatively lower CTE of the component (e.g., silicon) and the relatively higher CTE of an organic substrate (such as a circuit board, e.g., FR4). The proper choice of CTE is necessary for stress mitigation during manufacturing and subsequent use of the electronic assembly. The amount of inorganic filler used in the present invention may range from 0 to 80 wt %, preferably from 0.1 to 75 wt %, more preferably from 10 to 70 wt % based on the total weight of the solids in the composition.

Compositions of the present invention may optionally comprise one or more other epoxy resins in addition to the divinylarene dioxide and the hydroxy-substituted dioxide compound. A wide variety of epoxy resins may optionally be used in the present compositions. Suitable optional epoxy resins include, without limitation: difunctional epoxies which may be aliphatic or aromatic; trifunctional epoxies which may be aliphatic or aromatic; and monofunctional epoxies which may be aliphatic or aromatic. Exemplary optional difunctional epoxies are: diglycidyl ether of Bisphenol A; diglycidyl ether of Bisphenol F; diglycidyl ether of di-hydroxy naphathalene; hydrogenated diglycidyl ether of Bisphenol A/F; resorcinol diglycidyl ether; cyclohexane dimethanol diglycidyl ether; hexanedioldiglycidyl ether; and the like. Exemplary optional trifunctional epoxies are: triglycidyl hydroxyl aniline; trimethylolpropane diglycidyl ether; and the like. Exemplary optional monofunctional epoxies are: t-butyl phenyl glycidyl ether; cresyl glycidyl ether; hexylglycidylether; and the like. Such other epoxies are well-known in the art and are generally commercially available from a variety of sources. When such additional epoxies are used in the compositions of the invention, they are generally present in an amount of from 0 to 50 wt %, preferably from 10 to 40 wt %, and more preferably from 20 to 30 wt %.

A catalyst may optionally be added to the compositions of the invention. Generally, any homogeneous or heterogeneous catalyst known in the art which is appropriate for facilitating the reaction between an epoxy resin and a hardener may be used. The catalyst may include, but is not limited to, imidazoles, tertiary amines, phosphonium complexes, Lewis acids such as boron trifluoride complexes, or Lewis bases such as tertiary amines like diazabicycloundecene and 2-phenylimidazole, transition metal catalysts, quaternary salts such as tetrabutyphosphonium bromide and tetraethylammonium bromide, organoantimony halides such as triphenylantimony tetraiodide and triphenylantimony dibromide, and mixtures thereof.

When present, the concentration of the catalyst is generally from 0.05 to 10 wt %, preferably from 0.1 to 5 wt %, and most preferably from 0.15 to 1 wt % based on the total weight of the composition. The catalyst level can be adjusted to allow adequate processing in the final application.

Other optional components that may be useful in the present underfill compositions are components normally used in resin formulations known to those skilled in the art. For example, the optional other components may comprise flame retardants, diluents, stabilizers, compounds that can be added to the composition to enhance application properties (for example, surface tension modifiers or flow aids), reliability properties (for example, adhesion promoters) the reaction rate, the selectivity of the reaction, and/or the catalyst lifetime, and the like. The amount of such other optional components used in the compositions of the invention are those conventionally used in epoxy compositions.

Compositions of the invention may be prepared by blending a divinylbenzene dioxide, a hydroxy-substituted dioxide compound, curing agent, and any other optional ingredients as desired. Such blending may be achieved through the use of a Ross PD Mixer (Charles Ross), with or without vacuum. All the components of the compositions of the invention are typically mixed and dispersed at a temperature enabling the preparation of an effective epoxy resin composition, generally from 20 to 80° C., and preferably from 25 to 35° C. Lower mixing temperatures help to minimize reaction of the resin and curing agent components to maximize the pot life of the composition. The blended components are typically stored at sub-ambient temperatures to maximize shelf life. Acceptable temperature ranges are, for example, from −100 to 25° C., more preferably from −70 to 10° C., and even more preferably from −50 to 0° C.

In one embodiment, the compositions of the invention may be used as capillary underfill encapsulant in semiconductor packaging materials, such as to protect fragile electronic components, such as flip chip ball grid array (FC-BGA) and chip-scale packages (CSP). The initial step in this process is to apply the underfill along the edge of the chip. It then flows by capillary action into the gap between the chip and substrate. The underfill is subsequently cured in an oven, typically in the temperature range of 140-170° C., to create a thermoset reinforcement of the chip to substrate connections. The cured composition must cure free of voids in order to prevent solder extrusions that can bridge between two bumps, creating a short-circuit.

The cured underfill composition (that is, the cross-linked product made from the curable composition) of the present invention shows several improved properties over cured conventional, epoxy-based underfills. For example, the cured underfill of the present invention may have a glass transition temperature (Tg) of from −55 to 300° C. Generally, the Tg of the resin is higher than −60° C., preferably higher than 0° C., more preferably higher than 10° C., more preferably higher than 25° C., and most preferably higher than 50° C. Below −55° C., the technology described in this application does not provide any further significant advantage versus the conventional technology described in the prior art; and above 200° C., the technology described in the present application generally would lead to a very brittle network without the inclusion of toughening technologies which is not suitable for the applications within the scope of the present application and could also cause significant warpage of the device at low temperatures (for example, less than 0° C.). Preferably, the cured underfill composition of the present invention exhibits a glass transition temperature of from 25 to 300° C., more preferably from 50 to 250° C. and most preferably from 80 to 160° C. via ASTM D 3418.

EXAMPLES

The following components are used in the following Examples: divinylbenzene dioxide, manufactured by The Dow Chemical Company; naphthalene diglycidyl ether (HP4032D), manufactured by DIC and having the following structure:

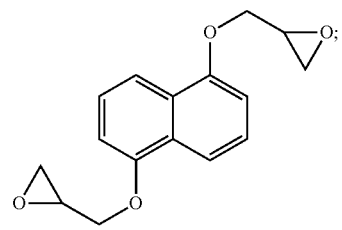 [SMILES: c1cc(OCC2CO2)c2cccc(OCC3CO3)c2c1]

diglycidyl ether of bisphenol F (Epiclon 830 LVP), manufactured by DIC; polymer of catechol and epichlorohydrin (Epiclon HP820), manufactured by DIC and having the following structure:

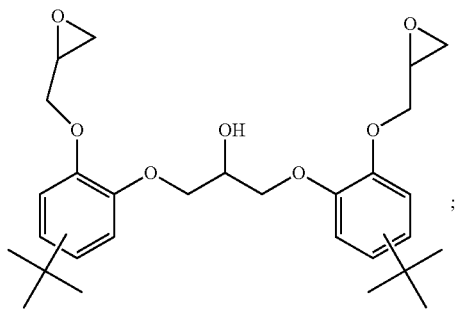

glycerol diglycidyl ether, available from Sigma-Aldrich and having the following structure:

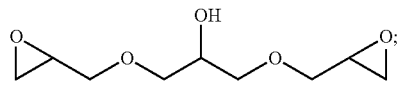 [SMILES: OC(COCC1CO1)COCC1CO1]

methylene bis-o-ethyl aniline (Kayahard AA), manufactured by Nippon Kayaku Co., Ltd., and Acetocure MBOEA (Aceto Corporation), and having the following structure:

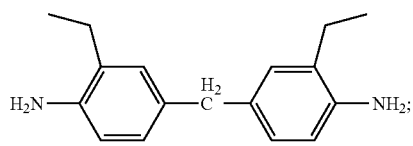

and conventional dispersants and diluents.

Example 1

Compositions were prepared by combining the components listed in Table 1 in the amounts shown into glass vials and were mixed by stirring. The amounts in Table 1 were all parts per hundred parts. Comparative Samples C1 and C2 did not contain a hydroxy-substituted dioxide compound, whereas Samples 1 and 2 each contained a HP820 (a hydroxy-substituted dioxide compound) along with divinylbenzene dioxide.

Weight loss was measured by weighing 21+/−3 mg of each composition into an aluminum thermogravimetric analysis (TGA) pan and heating the composition in a thermogravimetric analyzer according to the following profile: 100° C./60 min. and then 150° C./30 min. Weight loss was recorded as a percentage decrease in weight, and is reported in Table 1. It is clear from the data in Table 1 that Samples 1 and 2, which contained HP820 (a hydroxy-substituted diepoxide compound), showed reduced weight loss as compared to Comparative Samples C1 and C2 which did not contain a hydroxy-substituted diepoxide compound. Sample 1 showed a 30% reduction in weight loss as compared to Comparative Sample C1, and Sample 2 showed a 25% reduction in weight loss as compared to Comparative Sample C2.

TABLE 1

| Component | Comparative C1 | Sample 1 | Comparative C2 | Sample 2 |
|---|---|---|---|---|
| Divinylbenzene dioxide | 21.74 | 19.12 | 15.46 | 13.87 |
| HP4032D | 18.50 | 16.27 | — | — |
| 830 LVP | 25.48 | — | 52.58 | 29.20 |
| HP820 | — | 32.53 | — | 26.76 |
| Kayahard AA | 34.28 | 32.08 | 31.96 | 30.17 |
| Total | 100 | 100 | 100 | 100 |
| Wt Loss, wt % | 8.3 | 5.8 | 8.2 | 6.1 |

Example 2

The procedure of Example 1 was repeated except that the components listed in Table 2 were used in the amounts indicated. The diluent and dispersant used in these samples are conventional in the art. The amounts in Table 2 were all parts per hundred parts.

TABLE 2

| Component | Comparative C3 | Sample 3 | Sample 4 |
|---|---|---|---|
| Divinylbenzene dioxide | 28.99 | 29.26 | 29.90 |
| HP820 | — | 11.70 | 35.87 |
| Epiclon 830 LVP | 34.79 | 23.42 | — |
| Kayahard AA | 35.37 | 34.77 | 33.38 |
| Dispersant | 0.62 | 0.62 | 0.62 |
| Diluent | 0.22 | 0.22 | 0.22 |
| Total | 100.00 | 100.00 | 100.00 |
| Cure onset, ° C. | 165 | 153 | 127 |
| wt loss, % | 10.4 | 9.4 | 8.2 |

It is clear from the data in Table 2 that Samples 3 and 4, which contained HP820 (a hydroxy-substituted diepoxide compound), showed reduced weight loss as compared to Comparative Sample C3, which did not contain a hydroxy-substituted diepoxide compound. Samples 3 and 4 showed a 10% and 22% reduction in weight loss, respectively, as compared to Comparative Sample C3. Samples 3 and 4 also showed reduced cure onset and cure peak temperatures as compared to Comparative Sample C3, indicating a change in the reaction profile.

Example 3

The procedure of Example 1 was repeated except that the components listed in Table 3 were used in the amounts indicated. The amounts in Table 3 were all parts per hundred parts.

TABLE 3

| Component | Comparative C4 | Sample 5 | Sample 6 |
|---|---|---|---|
| Divinylbenzene dioxide | 30 | 30 | 30 |
| DGEBF | 34 | — | — |
| HP-820 | — | 36 | — |
| Glycerol diglycidyl ether | — | — | 29 |
| MBOEA-amine hardener | 36 | 34 | 41 |
| Cure onset, ° C. | 165 | 131 | 148 |
| Cure peak, ° C. | 199 | 184 | 189 |
| Weight loss, % | 15.2 | 10.3 | 10.5 |

The data in Table 3 clearly show that Samples 5 and 6, which contained HP820 and glycerol diglycidyl ether, respectively, each a hydroxy-substituted diepoxide compound, had reduced weight loss as compared to Comparative Sample C4, which did not contain a hydroxy-substituted diepoxide compound. Samples 5 and 6 showed a 32% and 31% reduction in weight loss, respectively, as compared to Comparative Sample C4. Samples 5 and 6 also showed reduced cure onset and cure peak temperatures as compared to Comparative Sample C4, indicating a change in the reaction profile.

Example 4

The procedure of Example 1 was repeated except that the components listed in Table 4 were used in the amounts indicated. A conventional dispersant was used. The amounts in Table 4 were all parts per hundred parts. The data in Table 4 clearly show that Samples 7 and 8, each of which contained HP820, had reduced weight loss as compared to Comparative Sample C5, which did not contain a hydroxy-substituted diepoxide compound. Samples 7 and 8 showed a 15% reduction in weight loss as compared to Comparative Sample C5.

TABLE 4

| Component | Comparative C5 | Sample 7 | Sample 8 |
|---|---|---|---|
| Divinylbenzene dioxide | 11.1 | 11.0 | 11.0 |
| 830 LVP | 14.3 | 8.7 | 0.0 |
| HP-820 | — | 6.0 | 15.5 |
| MBOEA Amine hardener | 14.0 | 13.5 | 12.9 |
| Silica (epoxy surface) | 60.0 | 60.0 | 60.0 |
| Dispersant | 0.5 | 0.5 | 0.5 |
| Total | 100 | 100 | 100 |
| wt loss, % | 4.35 | 3.73 | 3.72 |

Example 5

Comparative Sample C6 was prepared by combining the components listed in Table 5 in the amounts (in parts per hundred) shown into a glass vial and were mixed by stirring. Comparative Sample C6 did not contain a hydroxy-substituted dioxide compound, but instead contained a long chain secondary alcohol, 2-dodecanol. A portion (21+/−3 mg) of Comparative Sample C6 was weighed into an aluminum TGA pan and heated in a thermogravimetric analyzer according to the profile of Example 1. The cure onset and cure peak temperatures of Comparative Sample C6 were similar to those of Comparative Samples C3 and C4, indicating that a hydroxy-substituted compound that does not contain epoxide functionality does not function to change the reaction profile, and accordingly, will not reduce the volatility of the divinylarene dioxide.

TABLE 5

| Component | Comparative C6 |
|---|---|
| Divinylbenzene dioxide | 28 |
| DGEBF | 34 |
| HP-820 | — |
| Glycerol diglycidyl ether | — |
| MBOEA-amine hardener | 34 |
| 2-Dodecanol | 4 |
| Cure onset, ° C. | 165 |
| Cure peak, ° C. | 201 |

What is claimed is:

1. An underfill composition comprising a divinylarene dioxide, a hydroxy-substituted dioxide compound, and a curing agent, wherein the hydroxy-substituted dioxide compound has the structure

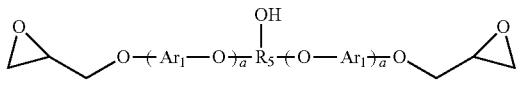

where $Ar_1$ is an arene residue; $R_5$ is a $(C_1-C_{12})$alkylene or $(C_1-C_{12})$alkylidene; and a =0 or 1.

2. The composition of claim 1 wherein the $R_5$ is a $(C_3-C_{12})$alkylene or $(C_3-C_{12})$alkylidene.

3. The composition of claim 1 wherein the $Ar_1$ is chosen from benzene, substituted benzenes, ring-annulated benzenes, substituted ring-annulated benzenes, homologously bonded benzenes, substituted homologously bonded benzenes, and mixtures thereof.

4. The composition of claim 1 wherein the divinylarene dioxide is divinylbenzene dioxide.

5. The composition of claim 1 further comprising an inorganic filler in an amount of 10 to 85 vol %.

6. The composition of claim 5 wherein the inorganic filler is selected from the group consisting of crystalline oxides, nitrides and carbides.

7. The composition of claim 6 wherein the inorganic filler is selected from the group consisting of silica, alumina, zirconia, berylia, ceria, zinc oxide, silicon nitride, aluminum nitride, boron nitride, and silicon carbide.

8. The composition of claim 1 wherein the curing agent is an aromatic amine.

9. A method of forming an electronic assembly comprising: providing an electronic component and a substrate, wherein one of the electronic component and the substrate has a plurality of interconnect structures and the other has a plurality of conductive bonding pads; electrically connecting the electronic component and the substrate; forming an underfill composition between the electronic component and the substrate; and curing the underfill composition; wherein the underfill composition comprises a divinylarene diepoxide, a hydroxy-substituted dioxide compound, and a curing agent, wherein the hydroxy-substituted dioxide compound has the structure

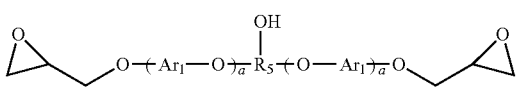

where $Ar_1$ is an arene residue; $R_5$ is a $(C_1-C_{12})$alkylene or $(C_1-C_{12})$alkylidene; and a =0 or 1.

10. The method of claim 9 wherein the curing agent is an aromatic amine.

11. The method of claim 9 wherein the underfill composition further comprises an inorganic filler in an amount of 10 to 85 vol %.

12. The method of claim 11 wherein the inorganic filler is selected from the group consisting of crystalline or amorphous oxides, nitrides and carbides.

* * * * *